United States Patent
Fisher et al.

(10) Patent No.: US 9,390,003 B2
(45) Date of Patent: Jul. 12, 2016

(54) RETIREMENT OF PHYSICAL MEMORY BASED ON DWELL TIME

(71) Applicant: INTERNATIONAL BUSINESS MACHINES CORPORATION, Armonk, NY (US)

(72) Inventors: Timothy J. Fisher, Cypress, TX (US); Aaron D. Fry, Richmond, TX (US)

(73) Assignee: International Business Machines Corporation, Armonk, NY (US)

(*) Notice: Subject to any disclaimer, the term of this patent is extended or adjusted under 35 U.S.C. 154(b) by 137 days.

(21) Appl. No.: 14/100,138

(22) Filed: Dec. 9, 2013

(65) Prior Publication Data

US 2015/0161035 A1    Jun. 11, 2015

(51) Int. Cl.
| | |
|---|---|
| G06F 12/00 | (2006.01) |
| G06F 12/02 | (2006.01) |
| G11C 29/42 | (2006.01) |
| G06F 13/00 | (2006.01) |
| G06F 13/28 | (2006.01) |
| G11C 29/04 | (2006.01) |

(52) U.S. Cl.
CPC ............ G06F 12/0246 (2013.01); G11C 29/42 (2013.01); *G06F 2212/7201* (2013.01); *G06F 2212/7205* (2013.01); *G11C 2029/0409* (2013.01); *G11C 2029/0411* (2013.01)

(58) Field of Classification Search
CPC .................. G06F 12/0246; G06F 2212/7201; G06F 2212/7205; G11C 29/42
USPC ........................................................ 711/103
See application file for complete search history.

(56) References Cited

U.S. PATENT DOCUMENTS

| | | | |
|---|---|---|---|
| 7,610,434 B2 | 10/2009 | Saito et al. | |
| 8,031,521 B1 * | 10/2011 | Yang | ......................... 365/185.02 |
| 8,199,577 B2 | 6/2012 | Shelton et al. | |
| 8,281,063 B2 | 10/2012 | Yu et al. | |
| 2010/0122148 A1 * | 5/2010 | Flynn | .................... G06F 11/108 714/773 |
| 2010/0332943 A1 | 12/2010 | D'Abreu et al. | |
| 2011/0302445 A1 * | 12/2011 | Byom | .................. G06F 12/123 714/6.1 |
| 2012/0008401 A1 | 1/2012 | Katz et al. | |
| 2012/0023365 A1 | 1/2012 | Byom et al. | |
| 2012/0236656 A1 | 9/2012 | Cometti et al. | |
| 2012/0239976 A1 * | 9/2012 | Cometti | ................. G11C 16/26 714/24 |

(Continued)

FOREIGN PATENT DOCUMENTS

EP    2299363 A1    3/2011

OTHER PUBLICATIONS

Chang, Yuan-Hao, "Efficient Wear Leveling in NAND Flash Memory", Institute of Information Science, Academia Sinica, Taipei, Taiwan, 2013.

(Continued)

*Primary Examiner* — Mark Giardino, Jr.
(74) *Attorney, Agent, or Firm* — Brian F. Russell; Randall J. Bluestone

(57) ABSTRACT

In at least one embodiment, a data storage system includes a non-volatile memory array including a plurality of regions of physical memory. The data storage system further includes a controller that controls read and write access to the memory array and retires selected ones of the plurality of regions of physical memory from use. The controller determines whether or not to retire a particular region among the plurality of regions of physical memory from use based on a dwell time of data stored in the particular region.

18 Claims, 9 Drawing Sheets

(56) References Cited

U.S. PATENT DOCUMENTS

2013/0080691 A1 3/2013 Weingarten et al.
2015/0026386 A1* 1/2015 Wakchaure et al. .......... 711/103

OTHER PUBLICATIONS

Doh, In Hwan, "Exploiting Non-Volatile RAM to Enhance Flash File System Performance", EMSOFT'07, AMC 978, Oct. 3, 2007.
Jiang, Anxiao, "Joint Coding for Flash Memory Storage", ISIT 2008, Toronto, Canada, IEEE, Jul. 6-11, 2008.

Wu, Michael, "eNVy: A Non-Volatile, Main Memory Storage System", AMC 1994.
International Application No. PCT/IB2014/066231, International Filing Date: Nov. 21, 2014, International Search Report and Written Opinion dated Mar. 17, 2015.
Fisher, U.S. Appl. No. 14/100,122, filed Dec. 9, 2013, Non-Final Office Action dated Jun. 17, 2015.
Fisher, U.S. Appl. No. 14/100,122, filed Dec. 9, 2013, Notice of Allowance dated Oct. 15, 2015.

* cited by examiner

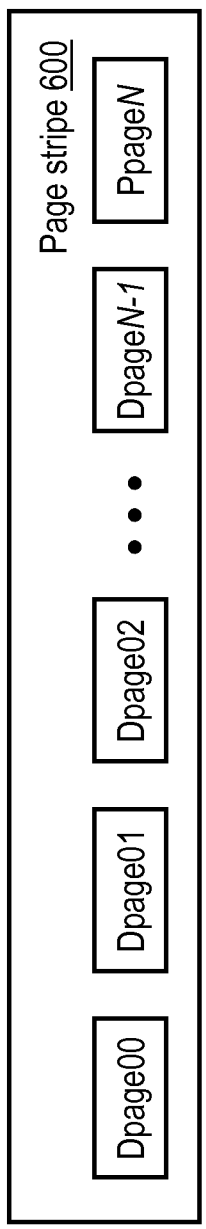
Fig. 6
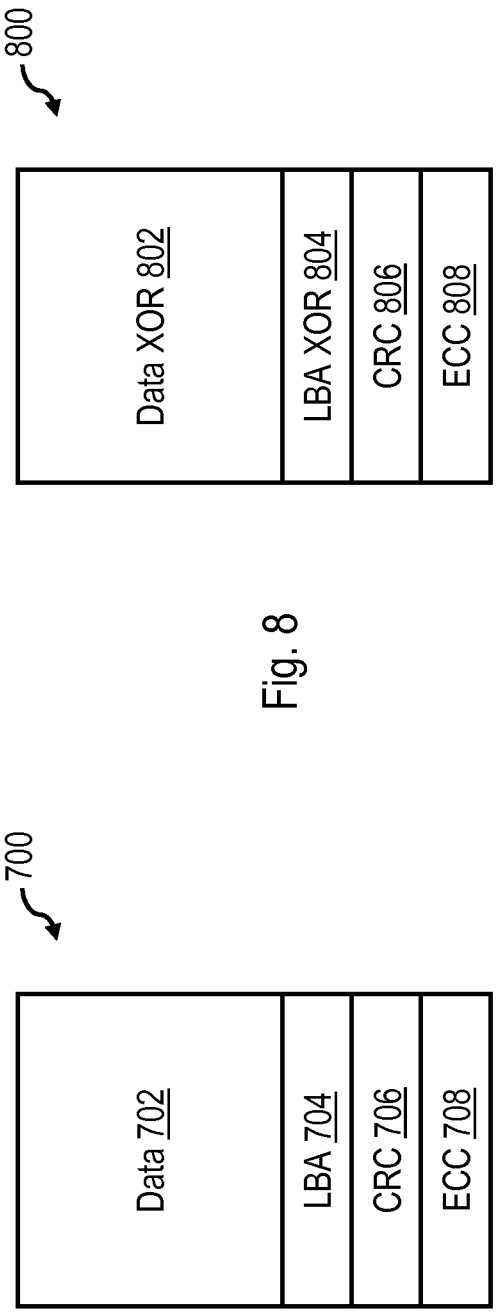
Fig. 8
Fig. 7

| Available Block Queue 154 | | |
|---|---|---|
| PBA 1102 | T 1104 | 1106 |
| ... | ... | ... |
| | | |

| Erased Block List 152 | |
|---|---|
| PBA 1002 | TS 1004 |
| ... | ... |
| | |

RETIREMENT OF PHYSICAL MEMORY BASED ON DWELL TIME

BACKGROUND OF THE INVENTION

This disclosure relates to data processing and storage, and more specifically, to the recording and use of dwell time in a non-volatile memory system, such as a flash memory system.

Flash memory is a non-volatile memory technology that stores one or more bits of data per memory cell as a charge on the floating gate of a transistor. As cell densities and the number of bits stored per cell in flash memory continue to increase in subsequent generations of flash technology, the data stored in the memory cells to become more vulnerable to bit errors induced by read disturbs, high ambient temperatures, long storage durations and other factors. Consequently, the number of read/write cycles for which flash memories are rated have generally been declining even while storage density and cost per unit of data have been improving.

BRIEF SUMMARY

The present disclosure recognizes that among the many factors that can be taken into account to extend the useful life of non-volatile memory (e.g., flash memory) and to improve data integrity is dwell time.

In at least one embodiment, a data storage system includes a non-volatile memory array and a controller coupled to the memory array. The controller records, for each of a plurality of valid pages in the memory array, a respective indication of a dwell time of each valid page.

In at least one embodiment, a data storage system includes a non-volatile memory array including a plurality of regions of physical memory. The data storage system further includes a controller that controls read and write access to the memory array and retires selected ones of the plurality of regions of physical memory from use. The controller determines whether or not to retire a particular region among the plurality of regions of physical memory from use based on a dwell time of data stored in the particular region.

In at least one embodiment, a data storage system includes a non-volatile memory array including a plurality of blocks of physical memory, each including multiple pages. The data storage system further includes a controller that maintains a data structure identifying blocks of physical memory in the memory array that currently do not store valid data. The controller, responsive to receipt of a write input/output operation (IOP) specifying an address and write data, selects a particular block from among the blocks identified in the data structure prior to a dwell time threshold for the particular block being satisfied, programs a page within the selected block with the write data, and associates the address with the selected block.

BRIEF DESCRIPTION OF THE SEVERAL VIEWS OF THE DRAWINGS

FIG. 6 depicts an exemplary implementation of a page stripes in accordance with the present disclosure;

FIG. 7 illustrates an exemplary data page in accordance with the present disclosure;

FIG. 8 depicts an exemplary data protection page in accordance with the present disclosure;

FIGS. 10-11 respectively depict exemplary embodiments of an erased block list and an available block queue maintained by a flash controller;

DETAILED DESCRIPTION

Figure 1:
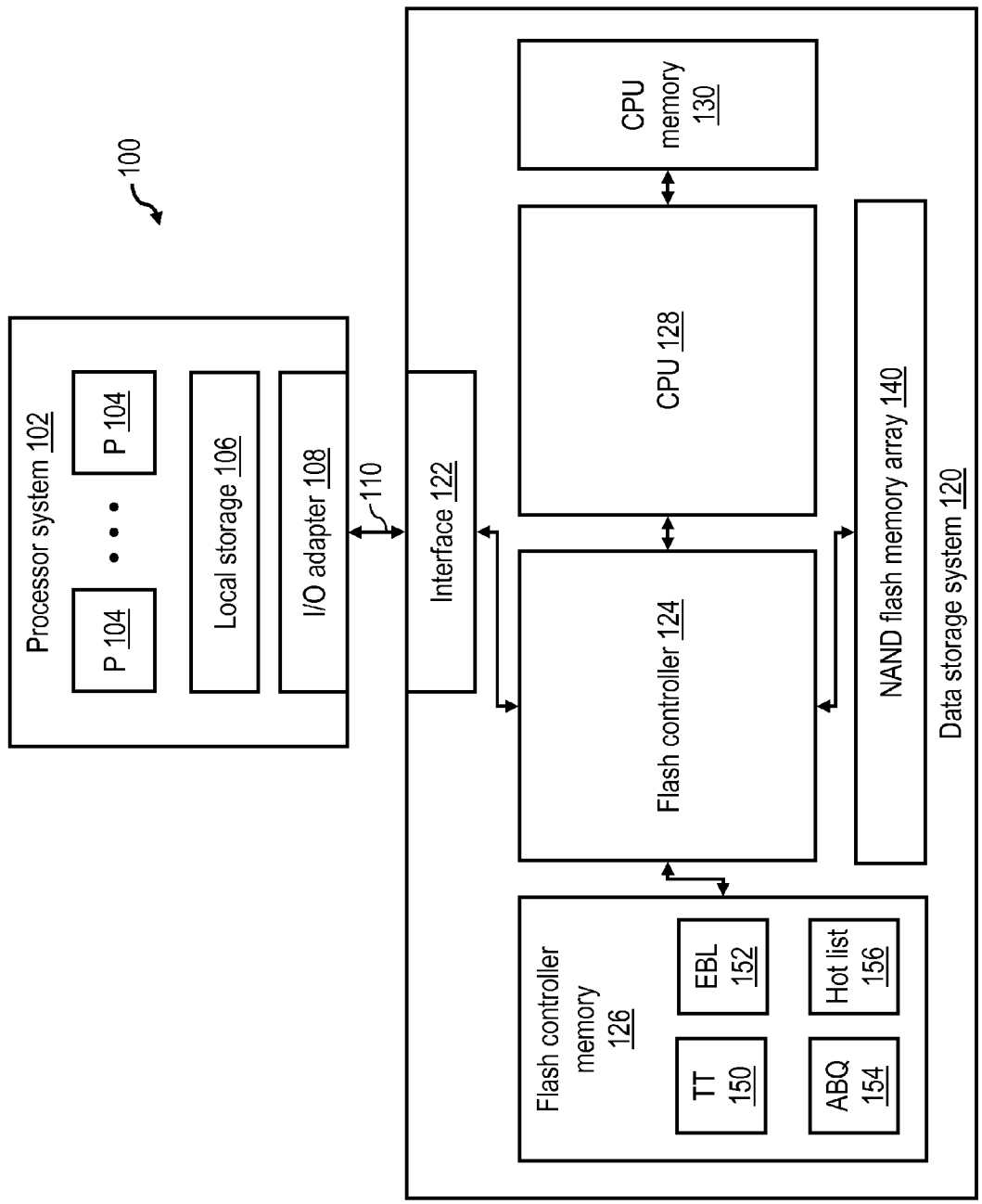
FIG. 1 is a high level block diagram of a data processing environment in accordance with one embodiment.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures and with particular reference to FIG. 1, there is illustrated a high level block diagram of an exemplary data processing environment 100 including a data storage system that employs NAND flash memory as described further herein. As shown, data processing environment 100 includes at least one processor system 102 having one or more processors 104 that process instructions and data. Processor system 102 may additionally include local storage 106 (e.g., dynamic random access memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER series available from International Business Machines Corporation), or a mainframe computer system. Processor system 102 can also be an embedded processor system using various processors such as ARM, PowerPC, Intel X86, or any other processor combined with memory caches, memory controllers, local storage, I/O bus hubs, etc.

Processor system 102 further includes an input/output (I/O) adapter 108 that is coupled directly (i.e., without any intervening device) or indirectly (i.e., through at least one intermediate device) to a data storage system 120 via an I/O channel 110. In various embodiments, I/O channel may employ any one or a combination of known or future developed communication protocols, including, for example, Fibre Channel (FC), FC over Ethernet (FCoE), Internet Small Computer System Interface (iSCSI), Transport Control Protocol/Internet Protocol (TCP/IP), Peripheral Component Interconnect Express (PCIe), etc. I/O operations (IOPs) communicated via I/O channel 110 include read IOPs by which processor system 102 requests data from data storage system 120 and write IOPs by which processor system 102 requests storage of data in data storage system 120.

In the illustrated embodiment, data storage system 120 includes an interface 122 through which data storage system 120 receives and responds to IOPs 102 via I/O channel 110. Interface 122 is coupled to a flash controller 124 (e.g., an Application Specific Integrated Circuit (ASIC) or Field Programmable Gate Array (FPGA)) having an associated flash controller memory 126 (e.g., Dynamic Random Access Memory (DRAM)). Flash controller 124 is additionally coupled to a CPU 128 having an associated CPU memory 130 (e.g., DRAM) and further coupled to a NAND flash memory array 140. In embodiments in which flash controller 124 is implemented with an FPGA, CPU 128 may program and configure flash controller 124 during start-up of data storage system 120. After startup, in general operation flash controller 124 receives read and write IOPs via I/O channel 110 and interface 122 to read data stored in NAND flash memory array 140 and/or to store data in NAND flash memory array 140. Flash controller 124 services these IOPs, for example, by accessing NAND flash memory array 140 to read or write the requested data from or into NAND flash memory array 140 or by accessing a memory cache (not illustrated) associated with NAND flash memory array 140.

Flash controller 124 implements a flash translation layer (FTL) that provides logical-to-physical address translation to enable access to specific memory locations within NAND flash memory array 140. In general, an IOP received by flash controller 124 from a host device, such as a processor system 102, contains the logical block address (LBA) at which the data is to be accessed (read or written) and, if a write IOP, the write data to be stored to data storage system 120. The IOP may also specify the amount (or size) of the data to be accessed. Other information may also be communicated depending on the protocol and features supported by data storage system 120. As is known to those skilled in the art, NAND flash memory, such as that employed in NAND flash memory array 140, is constrained by its construction such that the smallest granule of data that can be accessed by a read or write IOP is fixed at the size of a single flash memory page, for example, 16 kilobytes (kB). The LBA provided by the host device thus corresponds to a page within a logical address space. The flash translation layer translates this LBA into a physical address assigned to a corresponding physical location in NAND flash memory array 140. Flash controller 124 may perform address translation and/or store mappings between logical and physical addresses in a logical-to-physical translation data structure, such as translation table (TT) 150, which may conveniently be stored in flash controller memory 126.

As further shown in FIG. 1, flash controller 124 may maintain one or more additional data structures to track information regarding NAND flash memory array 140, which data structures may also be buffered in flash controller memory 126. These data structures can include, for example, an erased block list (EBL) 152 that identifies blocks of physical memory in NAND flash memory array 140 that have been erased, an available block queue (ABQ) that identifies blocks of physical memory in NAND flash memory array 140 that are available for programming with write data of write IOPs, and a hot list 156 that identifies frequently accessed LBAs. As will be appreciated by those skilled in the art, in various embodiments flash controller 124 may combine one or more of these data structures in a common data structure and/or implement additional data structures to manage NAND flash memory array 140.

NAND flash memory array 140 may take many forms in various embodiments. Referring now to FIGS. 2-5, there is depicted one exemplary arrangement of physical memory within a NAND flash memory array 140 in accordance with the present disclosure.

Figure 2:
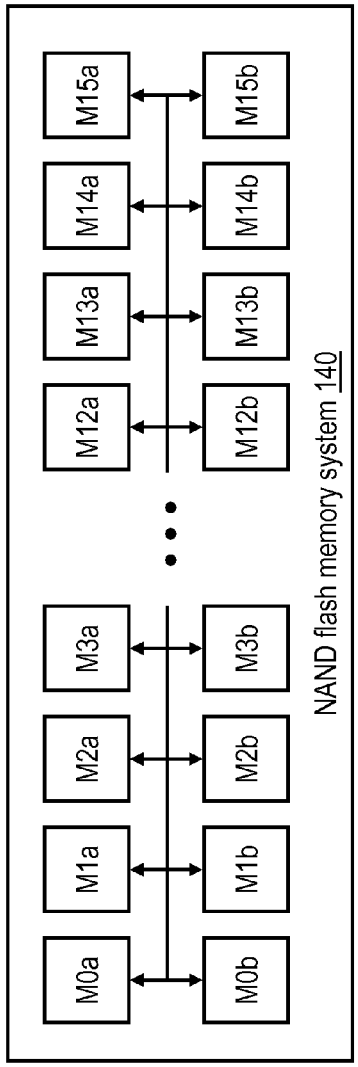
FIGS. 2-5 illustrate an exemplary arrangement of physical memory within a NAND flash memory array in accordance with the present disclosure.

As shown in FIG. 2, NAND flash memory array 140 may be formed from thirty-two (32) individually addressable NAND flash memory storage devices. In the illustrated example, each of the flash memory storage devices M0a-M15b takes the form of a board-mounted flash memory module, for example, a Single Level Cell (SLC), Multi-Level Cell (MLC), Three Level Cell (TLC), or Quad Level Cell (QLC) NAND flash memory module. The thirty-two NAND flash memory modules are arranged in sixteen groups of two (M0a, M0b) through (M15a, M15b). For purposes of the physical addressing scheme, each group of two modules forms a "lane," also sometimes referred to as a "channel," such that NAND flash memory array 140 includes sixteen channels or lanes (Lane0-Lane15).

In a preferred embodiment, each of the individual lanes has a respective associated bus coupling it to flash controller 124. Thus, by directing its communications to one of the specific communication buses, flash controller 124 can direct its communications to one of the lanes of memory modules. Because each communication bus for a given lane is independent of the communication buses for the other lanes, flash controller 124 can issue commands and send or receive data across the various communication buses at the same time, enabling flash controller 124 to access the memory modules corresponding to the individual lanes at, or very nearly at, the same time.

Figure 3:
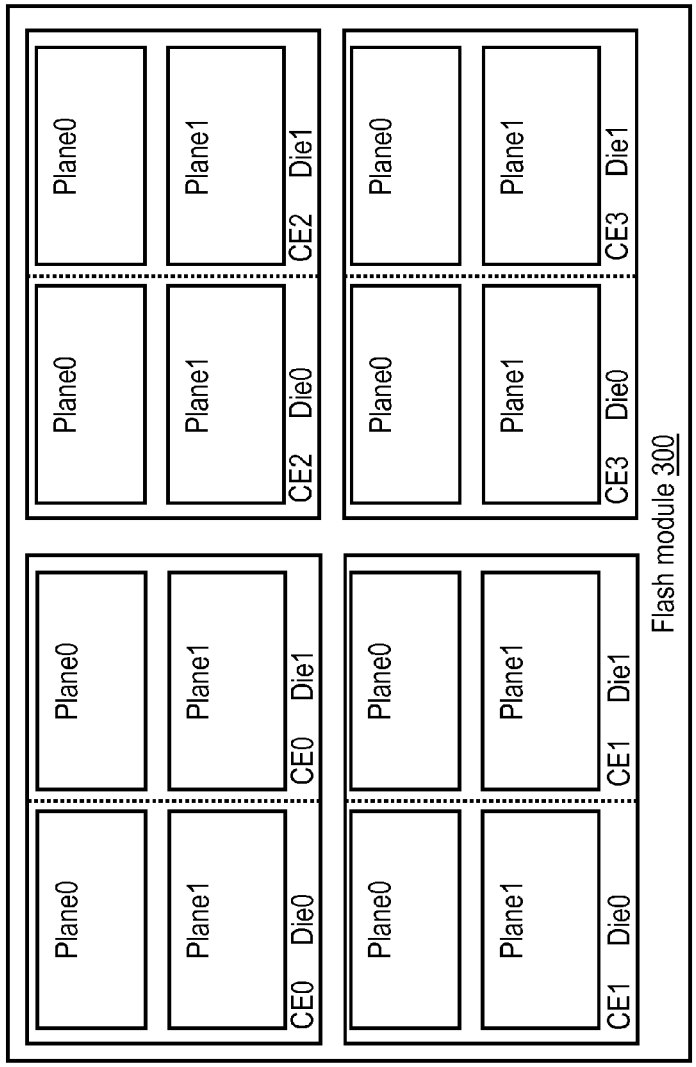

With reference now to FIG. 3, there is illustrated an exemplary embodiment of a flash memory module 300 that can be utilized to implement any of flash memory modules M0a-M15b of FIG. 2. As shown in FIG. 3, the physical storage locations provided by flash memory module 300 are further subdivided into physical locations that can be addressed and/or identified through Chip Enables (CEs). In the example of FIG. 3, the physical memory of each flash memory chip 300 is divided into four Chip Enables (CE0, CE1, CE2 and CE3), each having a respective CE line that is asserted by flash controller 124 to enable access to or from the physical memory locations within the corresponding CE. Each CE is in turn subdivided into multiple dice (e.g., Die0 and Die1) each having two planes (e.g., Plane0 and Plane1). Each plane represents a collection of blocks (described below) that, because of the physical layout of the flash memory chips, are physically associated with one another and that utilize common circuitry (e.g., I/O buffers) for the performance of various operations, such as read and write operations.

Figure 4:
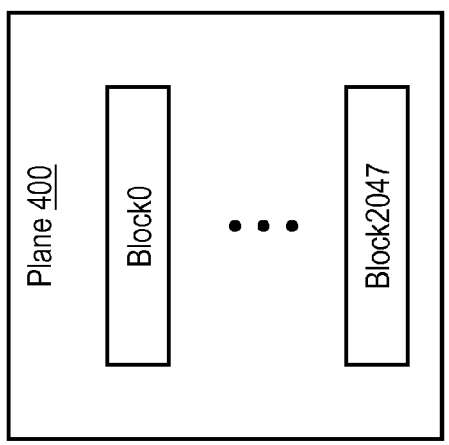
Figure 5:
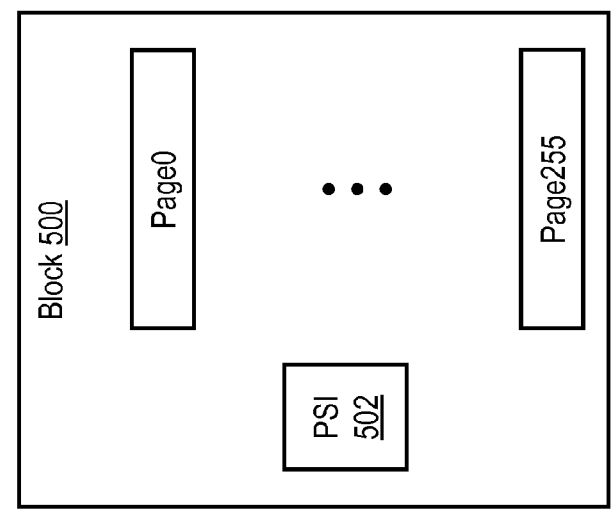

As further shown in FIGS. 4-5, an exemplary plane 400, which can be utilized to implement any of the planes within flash memory module 300 of FIG. 3, includes, for example, 2048 blocks of physical memory. In general, a block 500 is a collection of physical pages that are associated with one another, typically in a physical manner. This association is such that a block is defined to be the smallest granularity of physical storage locations that can be erased within NAND flash memory array 140. In the embodiment of FIG. 5, each block 500 includes, for example, 256 physical pages, where a physical page is defined to be the smallest individually addressable data unit for read and write access. In the exemplary system, each physical page of data has a common capacity (e.g., 16 kB) for data storage plus additional storage for metadata described in more detail below. Thus, data is written into or read from NAND flash memory array 140 on a page-by-page basis, but erased on a block-by-block basis. As further shown in FIG. 5, each block 500 preferably includes page status information 502, which indicates the status of each physical page in that block 500 as retired (i.e., withdrawn from use) or non-retired (i.e., active or still in use). In various implementations, PSI 502 can be collected into a single data structure (e.g., a vector or table) within block 500, distributed within block 500 (e.g., as one or more bits of metadata appended to each physical page) or maintained elsewhere in data storage system 120 (e.g., in a data structure in flash controller memory 126).

As noted above, data storage system 120 does not generally allow external devices to directly address and/or access the physical memory locations within NAND flash memory array 140. Instead, data storage system 120 is generally configured to present a single contiguous logical address space to the external devices, thus allowing host devices to read and write data to and from LBAs within the logical address space while permitting flash controller 124 and CPU 128 to control where the data that is associated with the various LBAs actually resides in the physical memory locations comprising NAND flash memory array 140. In this manner, performance and longevity of NAND flash memory array 140 can be intelligently managed and optimized.

As writes occur to data storage system 120, it will be necessary for flash controller 124 and CPU 128 to invalidate the data stored in one of the physical pages of one of the erase blocks in the NAND flash memory array 140. The new data will then be coalesced with data being written and eventually stored in different location in NAND flash memory array 140. It can be seen then that pages or portions of pages will be invalidated and therefore portions of the NAND flash memory array 140 become unused. Flash controller 124 and CPU 128 will eventually need to reclaim this space through a process called garbage collection. Particular erase blocks will be chosen based on a number of factors including how much of the data within the erase blocks is invalid. Flash controller 124 logs the physical block addresses (PBAs) of erased blocks in EBL 152. Valid data will be read and written along with new writes from the host into blocks allocated from ABQ 154.

Because the flash translation layer implemented by data storage system 120 isolates the logical address space made available to host devices from the physical memory within NAND flash memory array 140, the size of NAND flash memory array 140 need not be equal to the size of the logical address space presented to host devices. In most embodiments it is beneficial to present a logical address space that is less than the total available physical memory (i.e., to over-provision NAND flash memory array 140). Over-provisioning in this manner ensures that physical memory resources are available when the logical address space is fully utilized, even given the presence of a certain amount of invalid data as described above. In addition to invalid data that has not yet been reclaimed the overprovisioned space can be used to ensure there is enough logical space even given the presence of memory failures and the memory overhead entailed by the use of data protection schemes, such as Error Correcting Code (ECC), Cycle Redundancy Check (CRC), and parity.

In a preferred embodiment, data is typically written to groups of associated physical pages of NAND flash memory array 140 referred to herein as "page stripes." While the lengths of the various page stripes stored into NAND flash memory array 140 can and preferably do vary, in one embodiment each page stripe includes two to fifteen data pages of write data (typically provided by a host device) and one additional page (a "data protection page") used to store data protection information for the write data. For example, FIG. 6 illustrates an exemplary page stripe 600 including N data pages (i.e., Dpage00 through DpageN−1) and one data protection page (i.e., PpageN).

FIG. 7 illustrates an exemplary format of each data page within the page stripe 700. In this example, data page 700 includes a 16 kB data field 702, as well as additional fields for metadata describing the data page. In the illustrated example, these metadata fields include an LBA field 704 containing the LBA of data page 700, a CRC field 706 containing the CRC value computed for the combination of data field 702 and LBA field 704, and an ECC field 708 containing an ECC value calculated, in the illustrated example, from a combination of contents of data field 702, LBA field 704 and CRC field 706.

FIG. 8 depicts an exemplary format of the data protection page of page stripe 800. In the depicted example, data protection page 800 includes a data XOR field 802 that contains the bit-by-bit Exclusive Or (XOR) of the contents of the data fields 702 of the data pages 700 in page stripe 600. Data protection page 800 further includes an LBA XOR field 804 that contains the bit-by-bit XOR of the LBA fields 704 of the data pages 700 in page stripe 600. Data protection page 800 finally includes a CRC field 806 and ECC field 808 for respectively storing a CRC value and an ECC value for data protection page 800. Such a protection scheme is commonly referred to as RAID 5, since the parity field will not always be located on one particular flash plane. However, it should be appreciated that alternate data protection schemes such as Reed-Solomon can be used.

The formats for data pages and data protection pages described above protect data stored in a page stripe using multiple different protection mechanisms. First, the use of the ECC bits in each data page allows the correction of some number of bit errors within the flash page. Depending on the ECC method used it may be possible correct hundreds of bits or even thousands of bits within a NAND flash page. After ECC checking and correction is performed, the corrected CRC field is used to validate the corrected data. Used together, these two mechanisms allow for the correction of relatively benign errors and the detection of more serious errors using only local intra-page information. Should an uncorrectable error occur in a data page, for example, due to failure of the physical page utilized to store the data page, the contents of the data field and LBA field of the failing data page may be reconstructed from the other data pages and the data protection page for the page stripe.

While the physical memory locations in which the data pages and data protection page of a page stripe will vary within NAND flash memory array 140, in one embodiment the data pages and data protection page that comprise a given page stripe are preferably stored in physical memory locations selected to optimize the overall operation of the data storage system 120. For example, in some embodiments, the data pages and data protection page comprising a page stripe are stored such that different physical lanes are employed to store each of the data page and data protection page. Such embodiments support efficient access to a page stripe because flash controller 124 can access all of the pages of data that comprise the page stripe simultaneously or nearly simultaneously. It should be noted that the assignment of pages to lanes need not be sequential (i.e., data pages can be stored in any lane in any order), and unless a page stripe is a full length page stripe (e.g., containing fifteen data pages and one data protection page), the lanes utilized to store the page stripe need not be adjacent.

Having described the general physical structure and operation of data storage system 120, certain operational aspects of data storage system 120 are now described, including aspects relating to allocation of blocks for programming, writing (programming) pages of NAND flash memory array 140, and reading data from NAND flash memory array 140.

Figure 9:
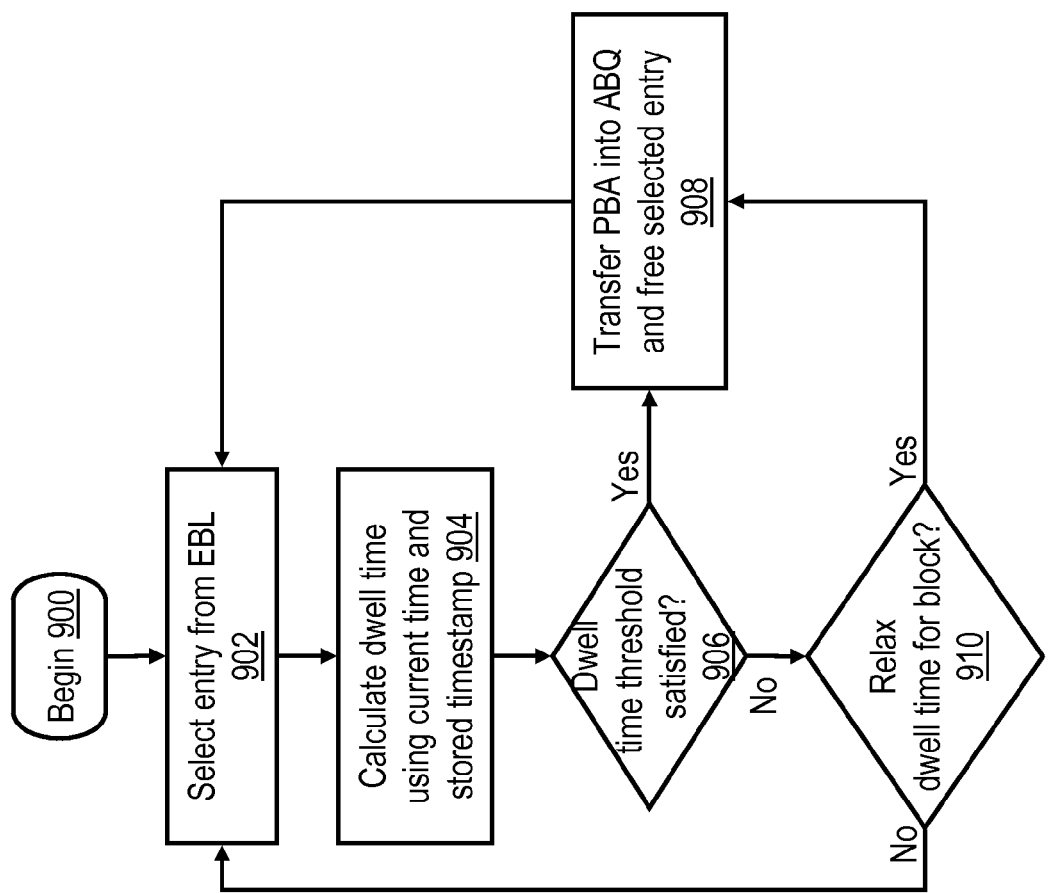
FIG. 9 is a high level logical flowchart of an exemplary process by which a flash controller transfers identifiers of blocks of physical memory from an erased block list to an available block queue prior to a dwell time threshold being satisfied in accordance with one embodiment.

With reference now to FIG. 9, there is illustrated a high level logical flowchart of an exemplary method of by which blocks of physical memory in NAND flash memory array 140 are made available for allocation for programming with write data. The method may be performed, for example, by flash controller 124 and/or CPU 128 in hardware, firmware, software or a combination thereof. For simplicity of explanation, it will hereafter be assumed that the process is performed by flash controller 124. As with the other flowcharts provided herein, steps are presented in logical rather than strictly chronological order, and in some embodiments at least some of the steps may be performed in an alternative order or concurrently.

When the process of FIG. 9 begins at block 900, flash controller 124 has populated erased block list (EBL) 152 through the garbage collection process with a plurality of entries identifying erased blocks of physical memory in NAND flash memory array 140. FIG. 10 illustrates one exemplary embodiment of EBL 152. In this exemplary embodiment, EBL 152 includes a plurality of entries 1000 each identifying a respective erased block of physical memory in NAND flash memory array 140 by its PBA 1002. Each entry 1000 preferably further includes an erase timestamp 1004 indicating an erase time of the block identified by the PBA 1002.

Returning to FIG. 9, the process proceeds from block 900 to block 902, which illustrates flash controller 124 selecting an entry 1000 from EBL 152, for example, the next sequential entry or the oldest entry. At block 904, flash controller 124 calculates the current dwell time of the block identified by the selected entry 1000, for example, by computing a difference between a current time (or in alternative embodiments, the time of a previous erasure or programming of the page) and the erase timestamp 1004 specified by the selected entry 1000. At block 906, flash controller 124 determines whether or not a dwell time threshold for the block has been satisfied (e.g., whether the dwell time computed at block 904 is equal to and/or greater than the dwell time threshold). In various embodiments, the dwell time threshold can be fixed (e.g., predetermined by the flash memory manufacturer) or variable over the operating life of the flash module 300 containing the memory block. Further, in at least some embodiments, the dwell time for different blocks can differ.

In response to a determination that the dwell time threshold of the block has been satisfied, flash controller 124 transfers at least the PBA 1002 from the selected entry 1000 in EBL 152 to an entry of available block queue (ABQ) 154 to make the block available for programming and frees the selected entry 1000 in EBL 152 (block 908). FIG. 11 illustrates one exemplary embodiment of ABQ 154 including a plurality of entries 1100, which each store a PBA 1102 of a block of physical memory in NAND flash memory 124 that is available for programming, timing information (T) 1104, and optionally, additional information 1106 related to the identified block. In various embodiments, timing information 1104 can include the current dwell time calculated at block 904, a flag indicating the outcome of the dwell time threshold determination at block 906, and/or the erase timestamp 1004 associated with the block in EBL 152.

If the dwell time threshold for the block identified by the selected entry 1000 is not satisfied (as represented by a negative determination at block 906), flash controller 124 may elect to nevertheless make the block available for programming based on one or more dynamic factors. For example, as shown at block 910, flash controller 124 may decide on a block-by-block basis to relax the dwell time based on whether flash controller 124 needs more blocks available for programming in ABQ 154, for example, as indicated by a high-to-low crossing of a low fill threshold of ABQ 154, a rate of receipt of write IOPs, and/or other measure of the current workload of data storage system 120. Further, flash controller 124 may alternatively or additionally relax the dwell time of a block based on receipt of one or more write IOPs for frequently accessed ("hot") addresses (e.g., as indicated by the addresses being present in hot list 156). In response to a determination at block 910 to relax the dwell time of the identified block of physical memory, the process passes to block 908, which has been described. Otherwise, the process of FIG. 9 returns to block 902 and following blocks, which have been described.

Figure 12:
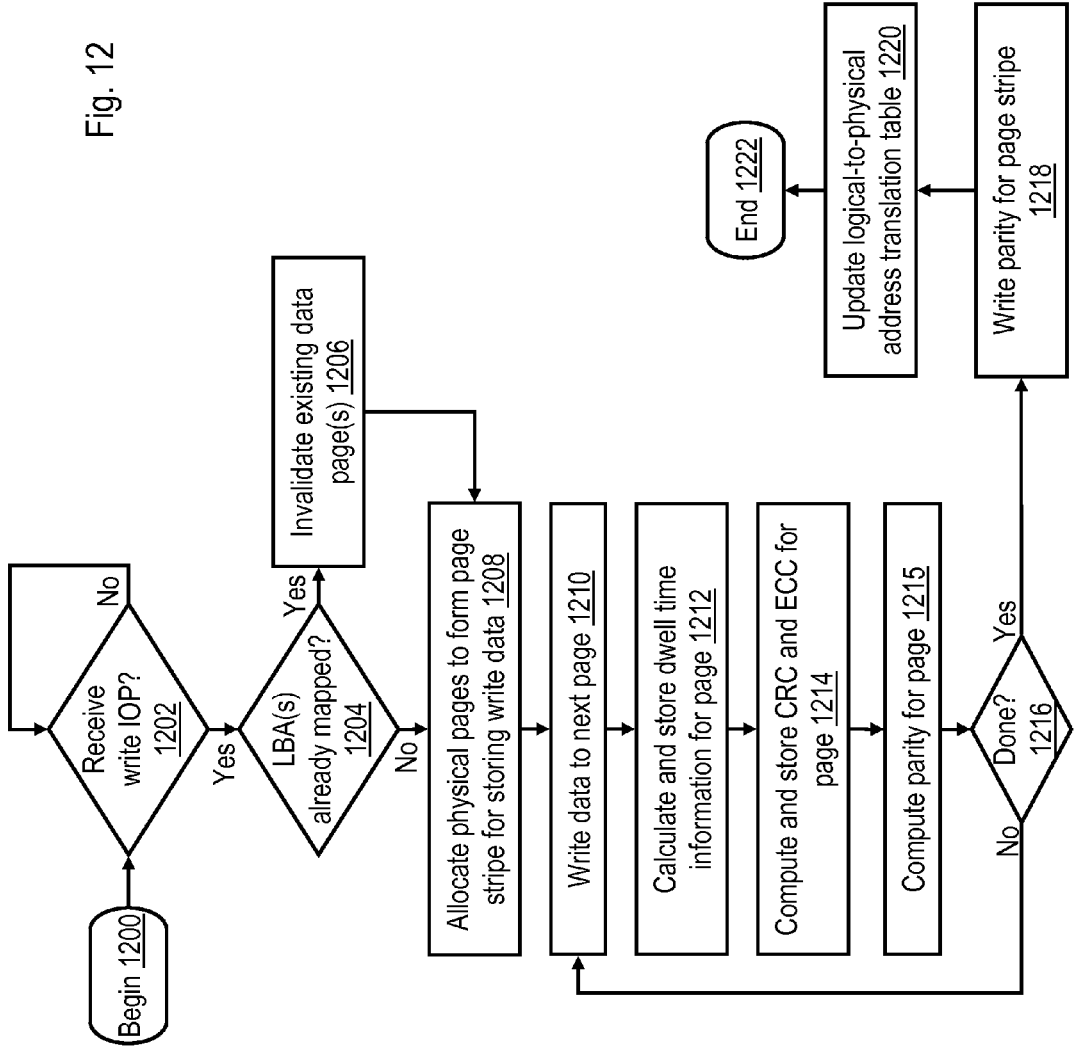
FIG. 12 is a high level logical flowchart of an exemplary embodiment of a data write process by which a data page and an associated dwell time are written to a NAND flash memory array.

Referring now to FIG. 12, there is illustrated a high level logical flowchart of an exemplary method of performing a write operation in data storage system 120. The method may be performed, for example, by flash controller 124 and/or CPU 128 in hardware, firmware, software or a combination thereof. For simplicity of explanation, it will hereafter be assumed that the process is performed by flash controller 124.

The method begins at block 1200 and then proceeds to block 1202, which illustrates flash controller 124 awaiting receipt of a write IOP from a host device, such as processor system 102. The write IOP includes, for example, data to be written into NAND flash memory array 140 and an indication of the target LBA(s) at which the host device would like for the data to be stored. In response to receipt of a write IOP, the process proceeds from block 1202 to blocks 1204-1106, which illustrates flash controller 124 determining (e.g., by reference to logical-to-physical address translation table 150) whether the target LBA(s) indicated in the write IOP is/are currently mapped to physical memory page(s) and, if so, changing the status of each data page currently associated with a target LBA to indicate that it is no longer valid. As is known in the art, invalidated pages (and the blocks containing them) will eventually be erased and again made available for allocation to store data by a garbage collection process of flash controller 124.

At block 1208, flash controller 124 allocates physical pages to form a page stripe to store the write data. As indicated at block 1210, flash controller 124 then begins to store the first data page of the write data to the first physical page allocated to the page stripe. At blocks 1212-1214, flash controller 124 additionally determines metadata for the page and stores the metadata in the memory block containing the page, either in the page itself or elsewhere in the memory block (e.g., as part of PSI 502). For example, at block 1212, flash controller 124 calculates and stores dwell time information for the page of physical memory, where the dwell time information can be defined utilizing one or more of the intervals from erasure-to-erasure, from programming-to-programming, from erasure-to-programming, or from programming-to-erasure. In at least some embodiments, the dwell time information can include a flag indicating whether or not a dwell time threshold for the page was satisfied prior to programming the page. The dwell time threshold employed at block 1212 can be the same as or differ from that employed at block 906 of FIG. 9 and can additionally be dynamic and change over time, for example, with positive correlation to the observed residual bit error rate (RBER). In at least some embodiments, the dwell time information can alternatively or additionally include a dwell time of the page and/or a timestamp of a time that the page was programmed. As further shown at block 1214, the metadata may further include CRC and ECC values for the data page, which flash controller 124 may store in CRC field 706 and ECC field 708 of the data page. At block 1215, flash controller 124 also computes the parity information for the data page.

At block 1216, flash controller 124 determines whether all of the write data has been written into NAND flash memory system 140. If flash controller 124 determines that less than all of the write data has been written to NAND flash memory system 140, the process returns to block 1210, which has been described. In response to a determination that all of the write data has been stored in NAND flash memory system 140 (and a determination that the parity computation for all data pages in the page stripe is complete), flash controller 124 stores the parity information for the page stripe in the data protection page of the page stripe (block 1218). Flash controller 124 also updates the logical-to-physical address translation table to associate the physical page(s) utilized to store the write data with the LBA(s) indicated by the host device (block 1220). Thereafter, the process of FIG. 12 ends at block 1222.

It should be noted that at least blocks 1208, 1210, 1212 and 1214 will include steps that check whether or not the programming of the physical page completed correctly. If flash controller 124 determines that the write did not complete correctly, then flash controller 124 will employ various recovery techniques, such as finishing the page stripe, including parity, and rebuilding the page stripe in a new location. If the write is unsuccessful, then flash controller 124 can also retire a physical page for which the write failed in the same manner as when a read is unsuccessful (as discussed below).

Figure 13:
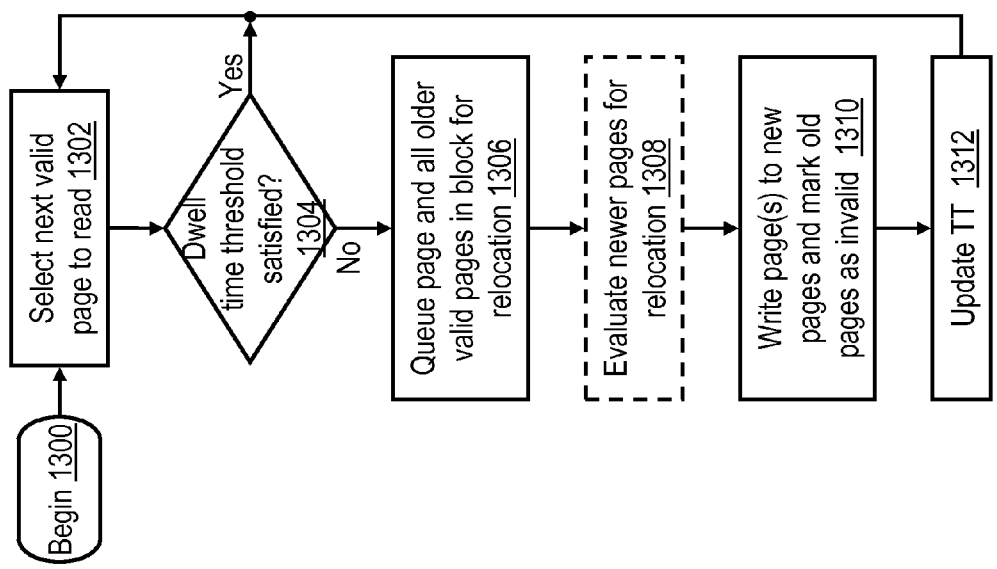
FIG. 13 is a high level logical flowchart of an exemplary process by which a flash controller relocates data pages stored within physical pages that do not satisfy a dwell time threshold.

With reference now to FIG. 13, there is illustrated a high level logical flowchart of an exemplary method of relocating pages that do not satisfy a dwell time threshold in one embodiment. The method may be performed, for example, by flash controller 124 and/or CPU 128 in hardware, firmware, software or a combination thereof. For simplicity of explanation, it will hereafter be assumed that the process is performed by flash controller 124.

The process of FIG. 13 begins at block 1300 and then proceeds to block 1302, which illustrates flash controller 124 selecting for reading a next page of physical memory in NAND flash memory array 140 that stores a valid data page. The selection performed at block 1302 can be made, for example, by a background reader process that operates when flash controller 124 is less than fully busy servicing read and write IOPs of processor systems 102. At block 1304, flash controller 124 determines whether or not a dwell time threshold for the page is satisfied. In various embodiments, the dwell time threshold employed at block 1304 can be the same as or differ from those employed at block 906 of FIG. 9 and block 1212 of FIG. 12. In embodiments in which the dwell time information stored at block 1212 of FIG. 12 includes a flag indicating whether or not the dwell time of the page is satisfied, the determination at block 1304 can include examining the flag. In at least some embodiments, the determination illustrated at block 1304 can include reading the dwell time from the memory block containing the memory page and/or computing the dwell time from a timestamp stored in the memory block containing the memory page and then comparing the dwell time to a dwell time threshold.

In response to a determination at block 1304 that the dwell time threshold for the selected page of physical memory is satisfied, the process returns to block 1302, which has been described. If, however, flash controller 124 determines at block 1304 that the dwell time threshold of the memory page is not satisfied (e.g., the dwell time for the page was relaxed as discussed above with reference to block 910 of FIG. 9), the process of FIG. 13 proceeds from block 1304 to block 1306. At block 1306, flash controller 124 queues the currently selected page of physical memory and all older valid pages of the same memory block for relocation of the data pages stored therein. In embodiments in which flash controller 124 writes to pages of blocks sequentially, flash controller 124 identifies the older valid pages as all valid pages of the block that precede the currently selected page. As shown at block 1308, flash controller 124 may also optionally evaluate more recently programmed pages of the same memory block for relocation of the data pages stored therein, for example, by comparing the dwell time information of such pages to a dwell time threshold. Flash controller 124 adds any more recently programmed pages identified for relocation at block 1308 to the relocation queue. In some embodiments, flash controller 124 begins the read operation depicted at block 1302 with the most recently written (e.g., highest) valid page in a block and works backwards through the pages of the block to the least recently written (e.g., lowest) valid page. In such embodiments, optional block 1308 may be omitted.

At block 1310, flash controller 124 relocates the data pages stored in the physical pages identified in the relocation queue to new physical pages and marks the old physical pages as invalid, for example, in PSI 502. The new physical pages to which the data pages are relocated can be either in the same block or a different block of physical memory, but are preferably pages for which the dwell time threshold is satisfied. Flash controller 124 can perform the relocation of data pages depicted at block 1310 as a low priority task that runs when the required resources of data storage system 120 are not otherwise needed to service the stream of read and write IOPs of processing system(s) 102. As shown at block 1312, as data pages are relocated, flash controller 124 updates translation table 150 with the new LBA-to-PBA mapping of each relocated data page. Following block 1312, the process of FIG. 13 continues at block 1302, which has been described.

Figure 14:
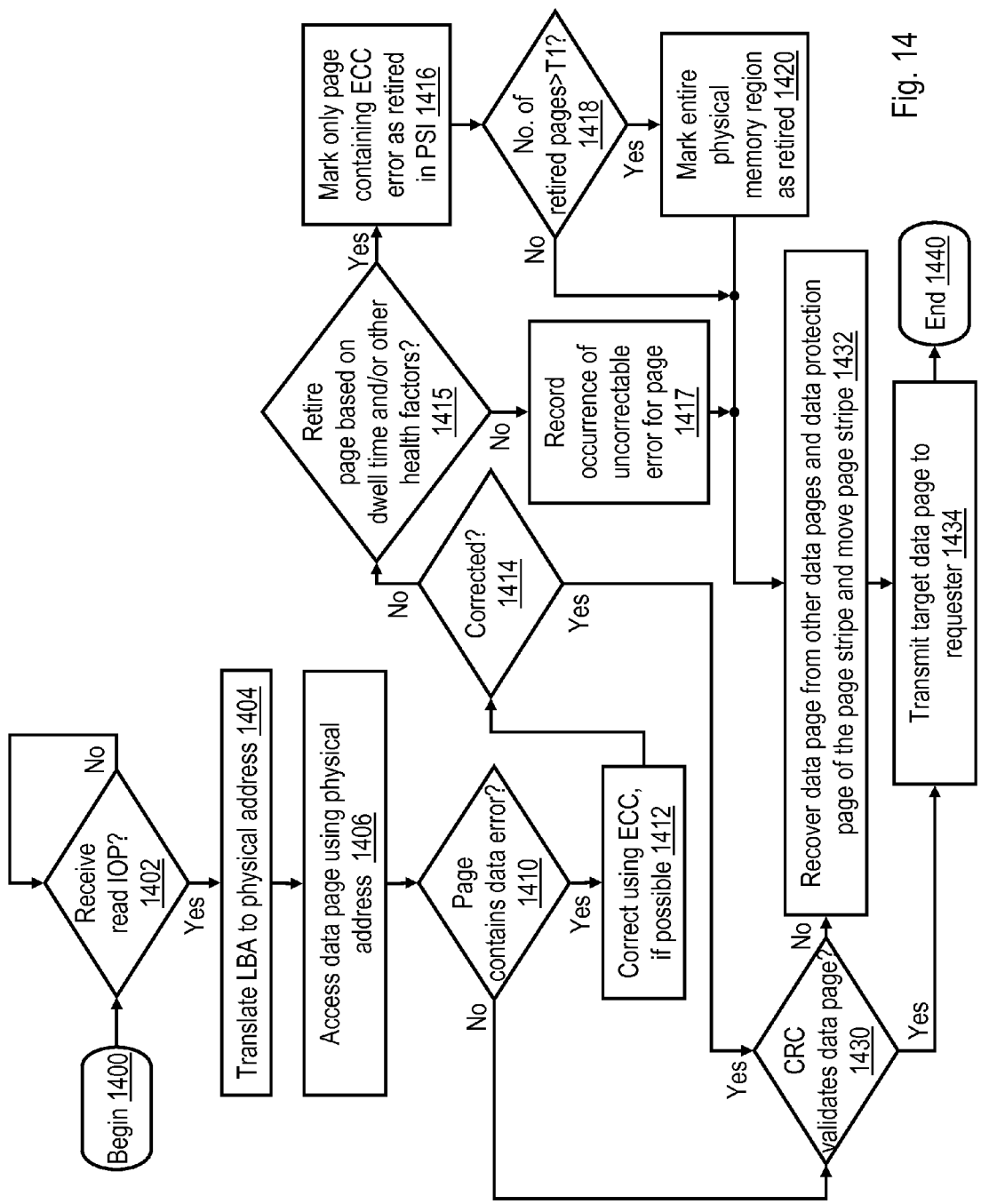
FIG. 14 is a high level logical flowchart of an exemplary embodiment of a data read process in which errors in a target data page can be handled in accordance with the dwell time of the physical page storing the target data page.

Referring now to FIG. 14, there is illustrated a high level logical flowchart of an exemplary method of performing a read operation in data storage system 120 in which physical memory may be retired on a page basis. The method may be performed, for example, by flash controller 124 and/or CPU 128 in hardware, firmware, software or a combination thereof. For simplicity of explanation, it will hereafter be assumed that the process is performed by flash controller 124.

The illustrated process begins at block 1400 and then proceeds to block 1402, which illustrates flash controller 124 awaiting receipt of a read IOP from an external host device, such as processor system 102. In general, the read IOP will specify the LBA of a target data page that is requested by the host device. In response to receipt of the read IOP, flash controller 124 translates the LBA (e.g., by reference to logical-to-physical translation table (TT) 150 in flash controller memory 126) to determine the physical address of the physical page that stores the requested data page (block 1404). Once the physical address is determined, flash controller 124 accesses the target data page utilizing the physical address by issuing a read request to read the target data page from the physical page associated with the physical address (block 1406). The read IOP may request various sizes of data, but for simplification it is assumed that the process of FIG. 14 is exercised once for each data page referenced by the read IOP.

At block 1410, flash controller 124 computes the ECC for the data page and compares the computed ECC with the ECC contents of ECC field 708 to determine whether or not the data page contains a data error. Such data errors can be due to any number of problems, including trapped charge in the oxide layer of the physical device or charge that has leaked from the floating gate. These errors may be permanent in nature such that the cell is no longer capable of storing and reading data correctly or the errors may be due to issues related to data retention or electrical noise inflicted by writes or reads of adjacent cells. Such errors will not be present when the cell is erased and then rewritten. True soft errors are substantially random and are typically not uniquely associated with any specific physical pages, blocks or other physical regions of NAND flash memory array 140. A hard error, on the other hand, is a corruption of one or multiple bits of data caused by a physical failure. Hard errors can be caused by a variety of factors including, but not limited to, the physical failure of one or more components within a given memory chip (such as the failure of a charge pump), the physical failure of an entire memory chip or the external support structures for that chip (e.g., the breaking of a power line or an address line to a chip), the physical failure of all or part of a chip as a result of environmental factors (e.g., excessive temperature, magnetic field, humidity, etc). In general, because hard errors arise from the physical structure of the memory system, hard errors are uniquely associated with a particular collection of memory chips, a particular memory chip, or specific physical regions within a chip (such as a CE, plane, block or page).

In response to a determination at block 1410 that the data page does not contain a data error, the process passes to block 1430, which is described below. However, in response to a determination at block 1410 that the data page contains a data error, flash controller 124 corrects the data error in the data page utilizing the ECC, if possible (e.g., if there are 50 bits in error within the codeword and the ECC is capable of correcting greater than 50 bits in error within the code word). At block 1414, flash controller 124 determines whether or not the detected data error has been corrected utilizing the ECC. If so, the process proceeds from block 1414 to block 1430, which is described below. If, on the other hand, flash controller 124 determines at block 1414 the data error is uncorrectable, flash controller 124 further determines at block 1415 whether or not the physical page that stores the data page in which the error occurred should be retired from use. The determination depicted at block 1415 can be made, for example, based on whether or not a dwell time threshold of the physical page storing the data page was satisfied and/or based on one or more health scores for the physical page (e.g., a frequency or number of data errors from a given physical memory region containing the physical page and/or a write/erase cycle count for the given physical memory region containing the physical page). For example, flash controller 124 may infer from the fact that the dwell time threshold of the physical page was not satisfied that the error may arise from programming the physical page with a relaxed dwell time rather than from a physical failure of a memory cell or circuit. In response to a determination at block 1415 that the physical page should be retired from use, the process proceeds to block 1416, which is described below. If, on the other hand, flash controller 124 determines that the physical page should not be retired, the process passes to block 1417, which illustrates flash controller 124 updating a health score of the physical page by recording the occurrence of an uncorrectable error in the physical page. Thereafter, the process passes to block 1432, which is described below.

At block 1416, flash controller 124 marks only the physical page that stores the target data page as retired (i.e., no longer available for allocation to store a data page of a new page stripe), for example, in the PSI 502 of the block containing that physical page. Thus, in contrast to prior art systems that retire physical memory in a NAND flash memory on a block-by-block basis, data storage system 120 can retire physical memory in NAND flash memory array 140 on a page-by-page basis in response to detection of a single data error. As will be appreciated, retirement of a physical page of physical memory (e.g., 16 kB) rather than a block (e.g., 4 MB) conserves physical memory resources, enhancing the performance and extending the life of NAND flash memory array 140. However, as a consequence of page retirement, the effective sizes of blocks of physical memory of NAND flash memory system 140 will vary.

This exemplary implementation waits until a physical page has one or more codewords containing uncorrectable errors before performing the retirement. However, certain implementations may choose to retire a page at some point prior to uncorrectability. For example, if an implementation uses BCH ECC over approximately 1024 bytes and can correct 50 bits in error, flash controller 124 may decide to retire a page when the number of uncorrectable bits reaches a number less than 50, say 48. Additionally, one skilled in the art will also know that, depending on the flash technology used, that flash controller 124 may elect to perform additional steps at blocks 1412-1414 before retiring the page. For example, the flash manufacturer may require flash controller 124 to change certain parameters for that page or block and perform a re-read of the page. If the data is still correctable, then flash controller 124 would follow the negative path from block 1414. In this way, blocks 1412-1414 may contain many additional steps not described herein in determining that the page contains a hard error or truly uncorrectable error.

At block 1418, flash controller 124 further determines by reference to PSI 502 whether or not the number of retired pages of physical memory in a physical memory region containing the page retired at block 1416 now satisfies (e.g., is greater than and/or equal to) a threshold T1. The physical memory region to which the first threshold T1 pertains can be, for example, a block, plane, die, CE or entire flash module. In response to flash controller 124 determining at block 1418 that the threshold T1 is not satisfied, the process passes to block 1430. However, in response to flash controller 124 determining at block 1418 that threshold T1 is satisfied, flash controller 124 marks the entire physical memory region containing the retired physical page as retired and thus unavailable for allocation to store new page stripes (block 1420). If the physical memory region for which retirement is determined at block 1418-1420 is a smaller region than an entire flash memory module, flash controller 124 may optionally determine whether or not to retire larger physical memory regions containing the retired physical page. It may also be determined that there are now too many retired memory resources within NAND flash memory system 140 to be able to achieve required performance levels, and flash controller 124 may send a response to the user indicating that it is time to replace the physical resource containing NAND flash memory system 140. The process then proceeds to block 1432.

At block 1430, flash controller 124 attempts to validate the data field 702 and LBA field 704 of the target data page by computing a cyclic redundancy code and comparing the computed CRC to that contained in CRC field 706. In response to successful validation of the data page, the process proceeds to block 1434, which is described below. However, in response to failure of the CRC validation at block 1430 or in connection with the processing described at blocks 1417, 1418 and/or 1420, flash controller 124 reads the entire page stripe and recovers the correct content of the target data page from the other data page(s) and the data protection page of the page stripe (block 1432). In addition, flash controller 124 moves the page stripe (including the recovered target data page) to a different physical location in NAND flash memory system 120 and invalidates the physical pages forming the old page stripe (if such pages are not retired). From block 1430 or block 1432, the process proceeds to block 1434, which illustrates flash controller 124 transmitting the target data page to the requesting host device. Thereafter, the process of FIG. 14 terminates at block 1440. The method of FIG. 14 may again be performed at some later unspecified time depending on other operations in process.

As noted above, the order of operations set forth in FIG. 14 is exemplary and embodiments are envisioned where the order of operations is different from that set out above. For example, embodiments are envisioned in which flash controller 124 transmits the data page to the host device prior to completing CRC validation and thereafter transmits an indication of whether the data page is valid or not. Also in some embodiments, the read IOP may access multiple data pages rather than a single data page.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As has been described, in at least one embodiment, a data storage system includes a non-volatile memory array and a controller coupled to the memory array. The controller records, for each of a plurality of valid pages in the memory array, a respective indication of a dwell time of each valid page.

In at least one embodiment, a data storage system includes a non-volatile memory array including a plurality of regions of physical memory. The data storage system further includes a controller that controls read and write access to the memory array and retires selected ones of the plurality of regions of physical memory from use. The controller determines whether or to not to retire a particular region among the plurality of regions of physical memory from use based on a dwell time of data stored in the particular region.

In at least one embodiment, a data storage system includes a non-volatile memory array including a plurality of blocks of physical memory, each including multiple pages. The data storage system further includes a controller that maintains a data structure identifying blocks of physical memory in the memory array that currently do not store valid data. The controller, responsive to receipt of a write input/output operation (IOP) specifying an address and write data, selects a particular block from among the blocks identified in the data structure prior to a dwell time threshold for the particular block being satisfied, programs a page within the selected block with the write data, and associates the address with the selected block.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transitory propagating media per se.

In addition, although embodiments have been described that include use of a NAND flash memory, it should be appreciated that the inventions herein are not limited to use with NAND flash memory, but are instead applicable to any other non-volatile random access memory (NVRAM) technology. For example, the disclosed techniques may be applied to phase-change memory (PCM), magnetoresistive RAM (MRAM) and resistive RAM (RRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a," is not intended as limiting of the number of items.

What is claimed is:

1. A data storage system, comprising:
a controller configured to be coupled to a non-volatile memory array including a plurality of regions of physical memory, wherein the controller controls read and write access to the memory array and retires selected ones of the plurality of regions of physical memory such that the selected ones of the plurality of regions are withdrawn from use and not again used for storing valid data, and wherein the controller, responsive to determining that a particular region among the plurality of regions of physical memory contains a data error that is uncorrectable by error correcting code (ECC), determines based on a dwell time of data stored in the particular region whether or not to retire the particular region such that the particular region is withdrawn from use and not again used for storing valid data.

2. The data storage system of claim 1, wherein:
the data storage system further includes the non-volatile memory array;
the dwell time is stored in the memory array in association with the particular region; and
the controller accesses the dwell time for the particular region from the particular region.

3. The data storage system of claim 1, wherein the controller determines not to retire the particular region in response to the dwell time not being long enough to satisfy a dwell time threshold.

4. The data storage system of claim 3, wherein:
the controller determines not to retire the particular region in response to the dwell time not being long enough to satisfy a dwell time threshold and an error count for the particular region failing to satisfy an error count threshold; and
the controller determines to retire the particular region in response to the dwell time failing to satisfy a dwell time threshold and an error count for the particular region satisfying an error count threshold.

5. The data storage system of claim 1, wherein:
the particular region is a single individual page of an erase block including a plurality of pages; and
the controller, responsive to determining to retire the single individual page, is configured to retire only the single individual page of the erase block and to retain in use one or more other pages of the erase block.

6. The data storage system of claim 1, wherein:
the data storage system further includes the non-volatile memory array;
the dwell time is stored in the memory array in association with the particular region;
the controller accesses the dwell time for the particular region from the particular region;
the controller determines not to retire the particular region in response to the dwell time not being long enough to satisfy a dwell time threshold and an error count for the particular region failing to satisfy an error count threshold;
the controller determines to retire the particular region in response to the dwell time failing to satisfy a dwell time threshold and an error count for the particular region satisfying an error count threshold; and
the particular region is a single individual page of an erase block including a plurality of pages; and
the controller, responsive to determining to retire the single individual page, is configured to retire only the single individual page of the erase block and to retain in use one or more other pages of the erase block.

7. A program product, comprising:
a storage device; and
program code stored in storage device that, when executed by a controller that controls read and write access to a non-volatile memory array including a plurality of regions of physical memory, causes the controller to perform:
responsive to determining that a particular region among the plurality of regions of physical memory contains a data error that is uncorrectable by error correcting code (ECC), the controller determining based on a dwell time of data stored in the particular region whether or not to retire the particular region such that the particular region is withdrawn from use and not again used for storing valid data; and
the controller, responsive to determining to retire the particular region, retiring the particular region such that the particular region is withdrawn from use and not again used for storing valid data.

8. The program product of claim 7, wherein:
the dwell time is stored in the memory array in association with the particular region; and
the program code further causes the controller to perform accessing the dwell time for the particular region from the particular region.

9. The program product of claim 7, wherein the determining includes the controller determining not to retire the particular region from use in response to the dwell time not being long enough to satisfy a dwell time threshold.

10. The program product of claim 9, wherein:
the determining includes:
the controller determining not to retire the particular region in response to the dwell time not being long enough to satisfy a dwell time threshold and an error count for the particular region failing to satisfy an error count threshold; and
the controller determining to retire the particular region in response to the dwell time failing to satisfy a dwell time threshold and an error count for the particular region satisfying an error count threshold.

11. The program product of claim 7, wherein:
the particular region is a single individual page of an erase block including a plurality of pages; and
the program code, when executed, causes the controller, responsive to determining to retire the single individual page, to retire only the single individual page of the erase block and to retain in use one or more other pages of the erase block.

12. The program product of claim 7, wherein:
the dwell time is stored in the memory array in association with the particular region;
the program code further causes the controller to perform accessing the dwell time for the particular region from the particular region;
the determining includes:
the controller determining not to retire the particular region in response to the dwell time not being long enough to satisfy a dwell time threshold and an error count for the particular region failing to satisfy an error count threshold; and
the controller determining to retire the particular region in response to the dwell time failing to satisfy a dwell time threshold and an error count for the particular region satisfying an error count threshold;

the particular region is a single individual page of an erase block including a plurality of pages; and
the program code, when executed, causes the controller, responsive to determining to retire the single individual page, to retire only the single individual page of the erase block and to retain in use one or more other pages of the erase block.

13. A method of operating a data storage system, comprising:
a controller controlling reading from and writing to a non-volatile memory array;
responsive to determining that a particular region among the plurality of regions of physical memory contains a data error that is uncorrectable by error correcting code (ECC), the controller determining based on a dwell time of data stored in the particular region whether or not to retire the particular region such that the particular region is withdrawn from use and not again used for storing valid data; and
the controller, responsive to determining to retire the particular region, retiring the particular region such that the particular region is withdrawn from use and not again used for storing valid data.

14. The method of claim 13, wherein:
the dwell time is stored in the memory array in association with the particular region; and
the method further comprises the controller accessing the dwell time for the particular region from the particular region.

15. The method of claim 13, wherein the determining includes the controller determining not to retire the particular region in response to the dwell time not being long enough to satisfy a dwell time threshold.

16. The method of claim 15, wherein:
the determining includes:
the controller determining not to retire the particular region in response to the dwell time not being long enough to satisfy a dwell time threshold and an error count for the particular region failing to satisfy an error count threshold; and
the controller determining to retire the particular region in response to the dwell time failing to satisfy a dwell time threshold and an error count for the particular region satisfying an error count threshold.

17. The method of claim 13, wherein:
the particular region is a single individual page of an erase block including a plurality of pages; and
the method further includes the controller, responsive to determining to retire the single individual page, retiring only the single individual page of the erase block and retaining in use one or more other pages of the erase block.

18. The method of claim 13, wherein:
the dwell time is stored in the memory array in association with the particular region;
the method further comprises the controller accessing the dwell time for the particular region from the particular region;
the determining includes:
the controller determining not to retire the particular region in response to the dwell time not being long enough to satisfy a dwell time threshold and an error count for the particular region failing to satisfy an error count threshold; and
the controller determining to retire the particular region in response to the dwell time failing to satisfy a dwell time threshold and an error count for the particular region satisfying an error count threshold;
the particular region is a single individual page of an erase block including a plurality of pages; and
the method further includes the controller, responsive to determining to retire the single individual page, retiring only the single individual page of the erase block and retaining in use one or more other pages of the erase block.

* * * * *